(12) United States Patent
Nawashiro et al.

(10) Patent No.: US 8,008,674 B2
(45) Date of Patent: Aug. 30, 2011

(54) LIGHT EMITTING DEVICE AND LCD BACKLIGHTING DEVICE

(75) Inventors: Mitsuhiro Nawashiro, Aichi-ken (JP); Hiroyuki Tajima, Aichi-ken (JP); Hisao Yamaguchi, Aichi-ken (JP)

(73) Assignee: Toyoda Gosei Co., Ltd., Aichi-Ken (JP)

( * ) Notice: Subject to any disclaimer, the term of this patent is extended or adjusted under 35 U.S.C. 154(b) by 541 days.

(21) Appl. No.: 11/802,105

(22) Filed: May 18, 2007

(65) Prior Publication Data

US 2007/0284597 A1    Dec. 13, 2007

(30) Foreign Application Priority Data

May 29, 2006   (JP) .................................. 2006-148750
Jun. 9, 2006   (JP) .................................. 2006-160554

(51) Int. Cl.
*H01L 29/20*    (2006.01)

(52) U.S. Cl. ................. 257/89; 257/72; 257/79; 257/83; 257/E31.111; 257/E23.04

(58) Field of Classification Search ............. 257/59–72, 257/79–83, 89, E31.111, E23.04; 438/22, 438/24, 48, 64
See application file for complete search history.

(56) References Cited

U.S. PATENT DOCUMENTS

| 5,698,889 | A  | * | 12/1997 | Abe ............................... 257/434 |
| 2002/0048163 | A1 | | 4/2002 | Kawakami et al. |
| 2004/0189170 | A1 | * | 9/2004 | Aisenbrey ..................... 313/248 |
| 2005/0117357 | A1 | * | 6/2005 | Ishii et al. ..................... 362/458 |
| 2005/0263786 | A1 | | 12/2005 | Isoda |
| 2008/0070334 | A1 | * | 3/2008 | Krames et al. ................. 438/32 |

FOREIGN PATENT DOCUMENTS

| JP | 2002-025326(A) | 1/2002 |
| JP | 2003-234008 | 8/2003 |
| JP | 2005-109382(A) | 4/2005 |

OTHER PUBLICATIONS

Japanese Office Action dated May 24, 2011 with a partial English translation.

* cited by examiner

*Primary Examiner* — Cuong Q Nguyen
*Assistant Examiner* — Cathy N Lam
(74) *Attorney, Agent, or Firm* — McGinn IP Law Group, PLLC

(57) ABSTRACT

A light emitting device has a mount with a protruding portion that has an element mounting surface on which a light emitting element is mounted and a first lead and a second lead are exposed. The light emitting element has a first electrode and a second electrode that are electrically connected to the first lead and the second lead, respectively.

10 Claims, 11 Drawing Sheets

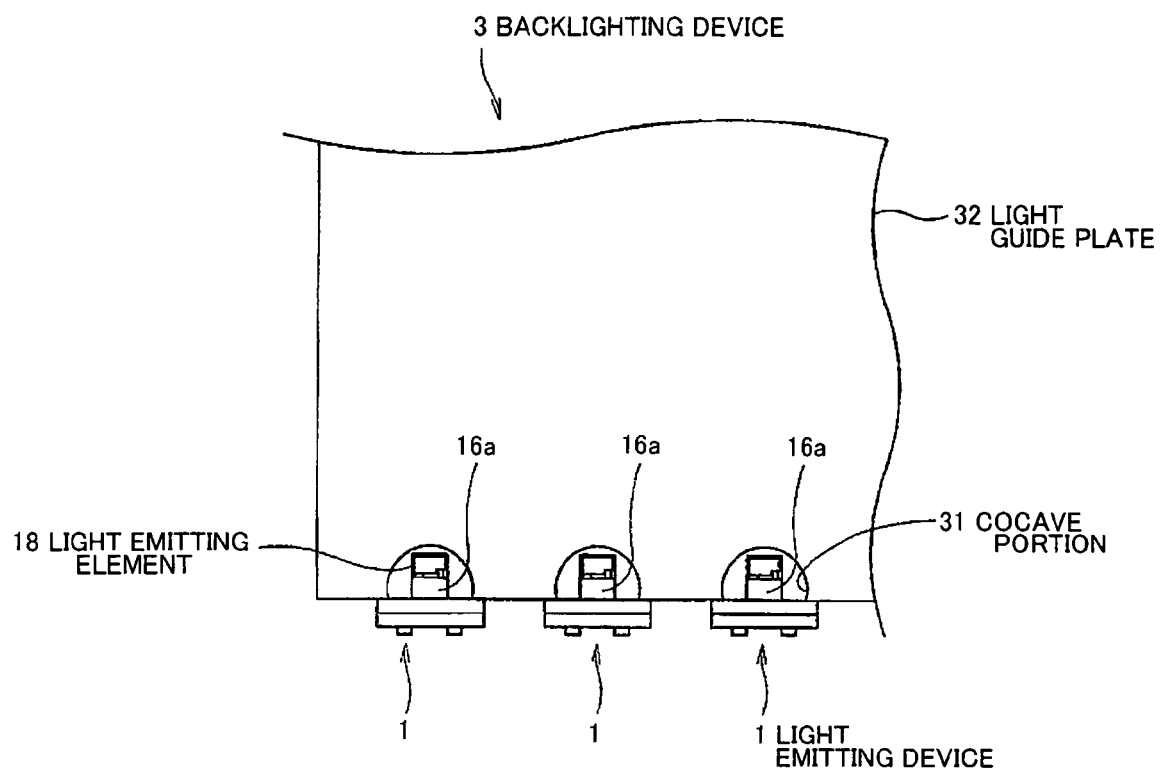

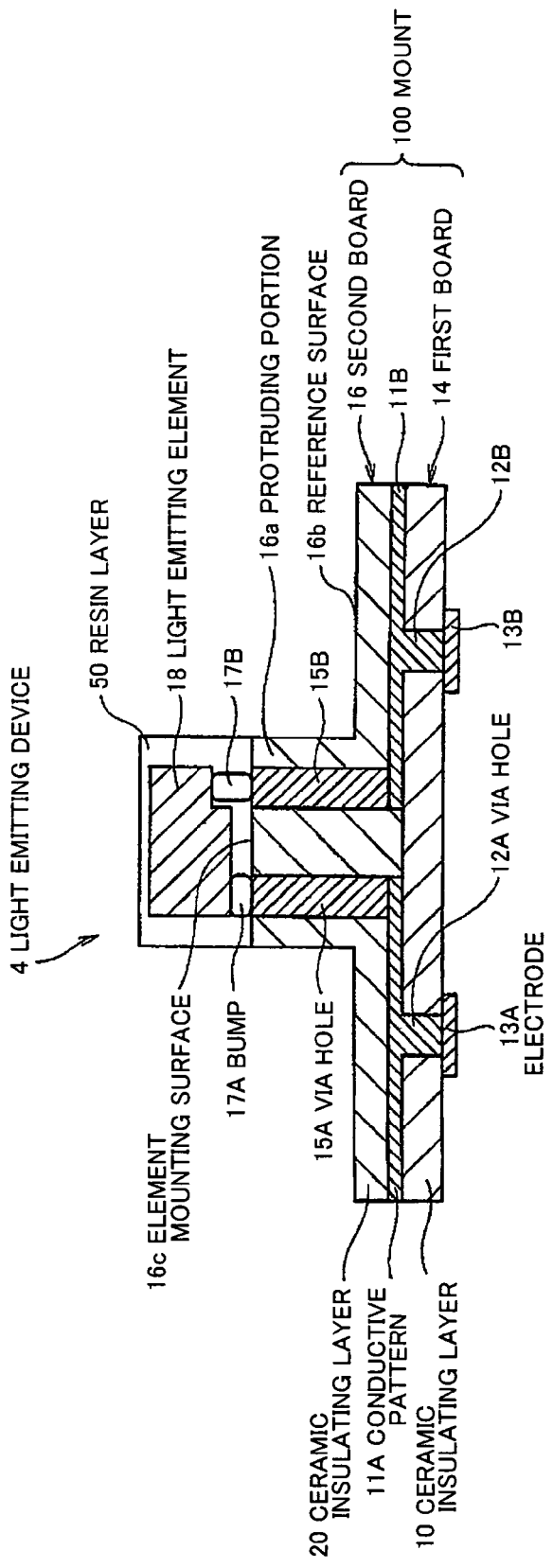

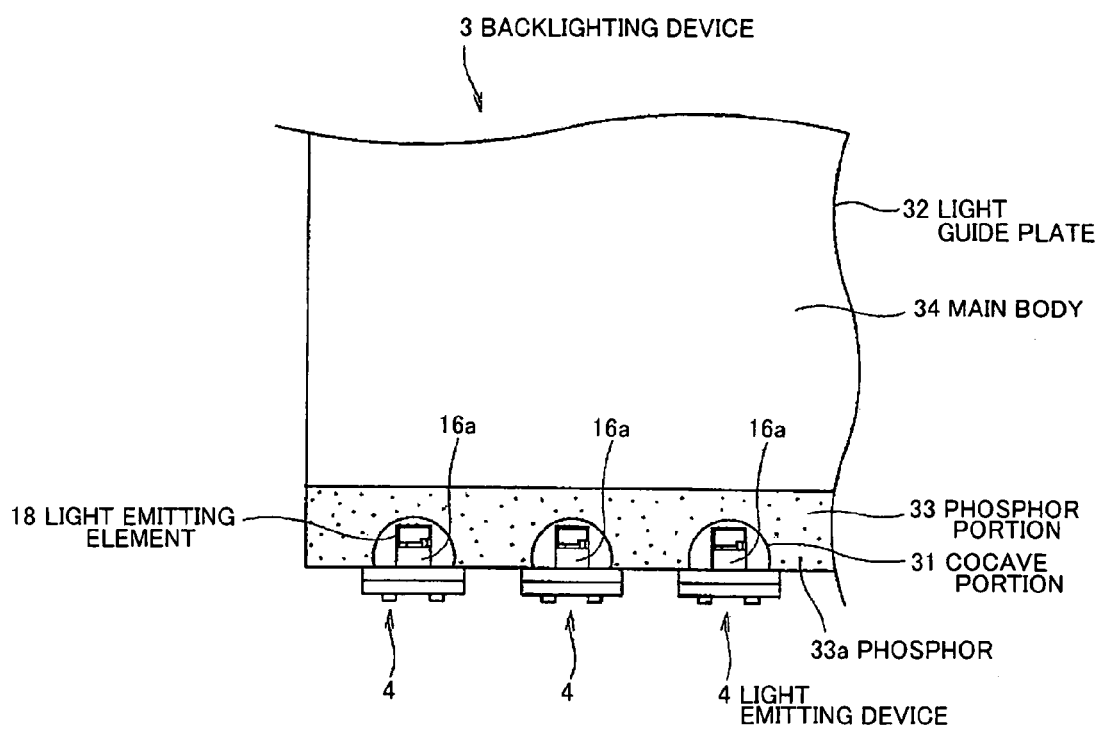

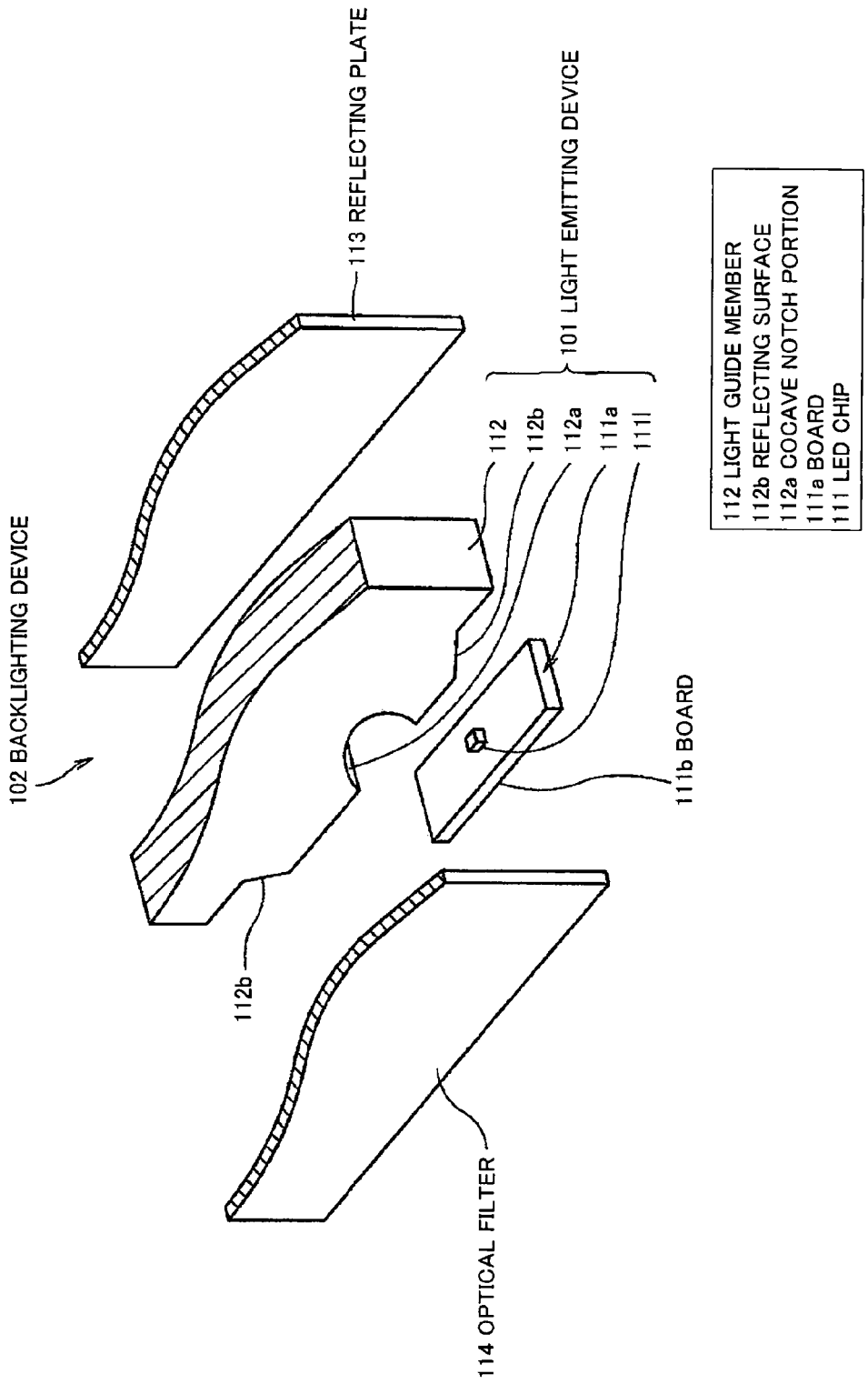

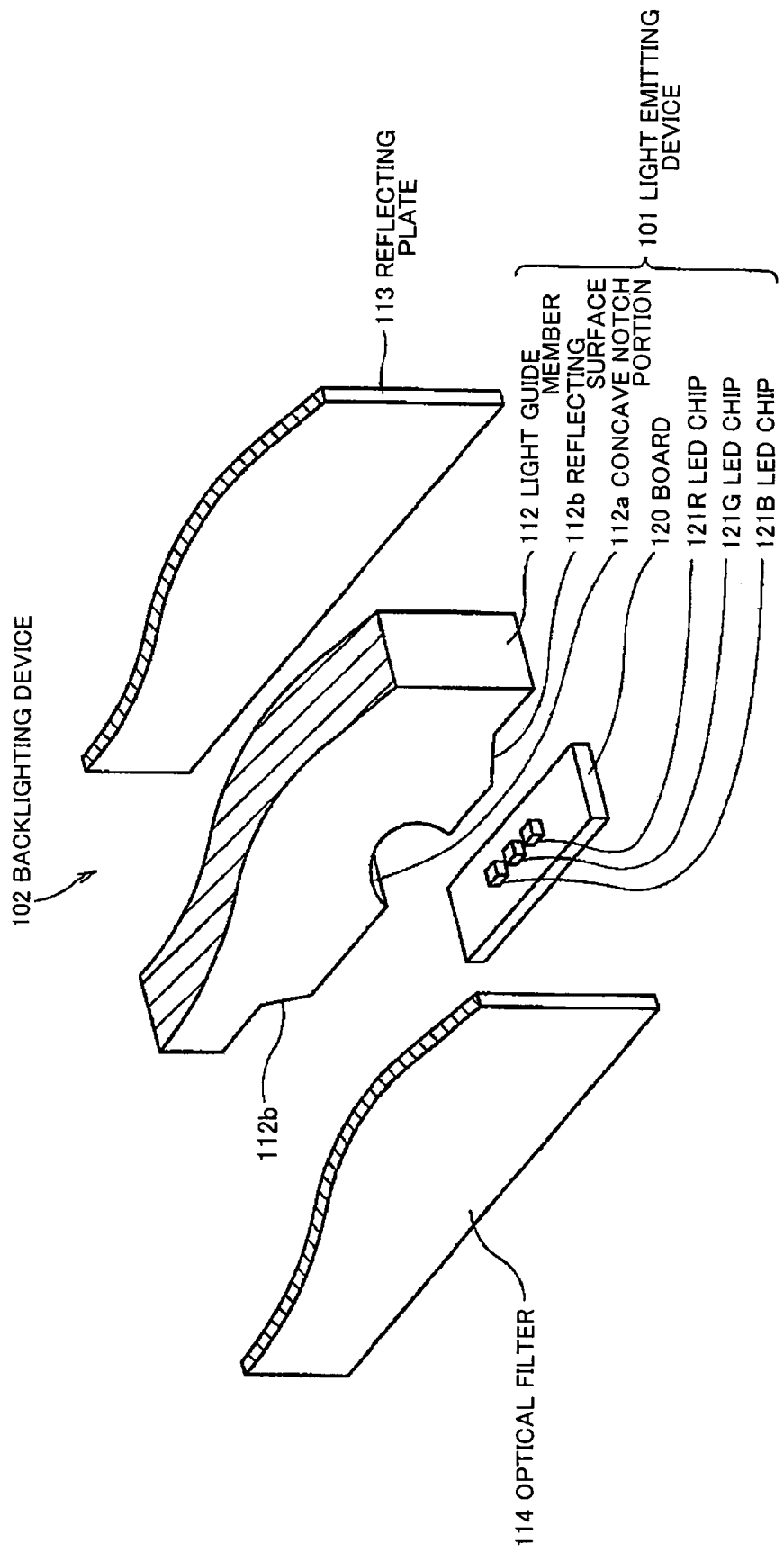

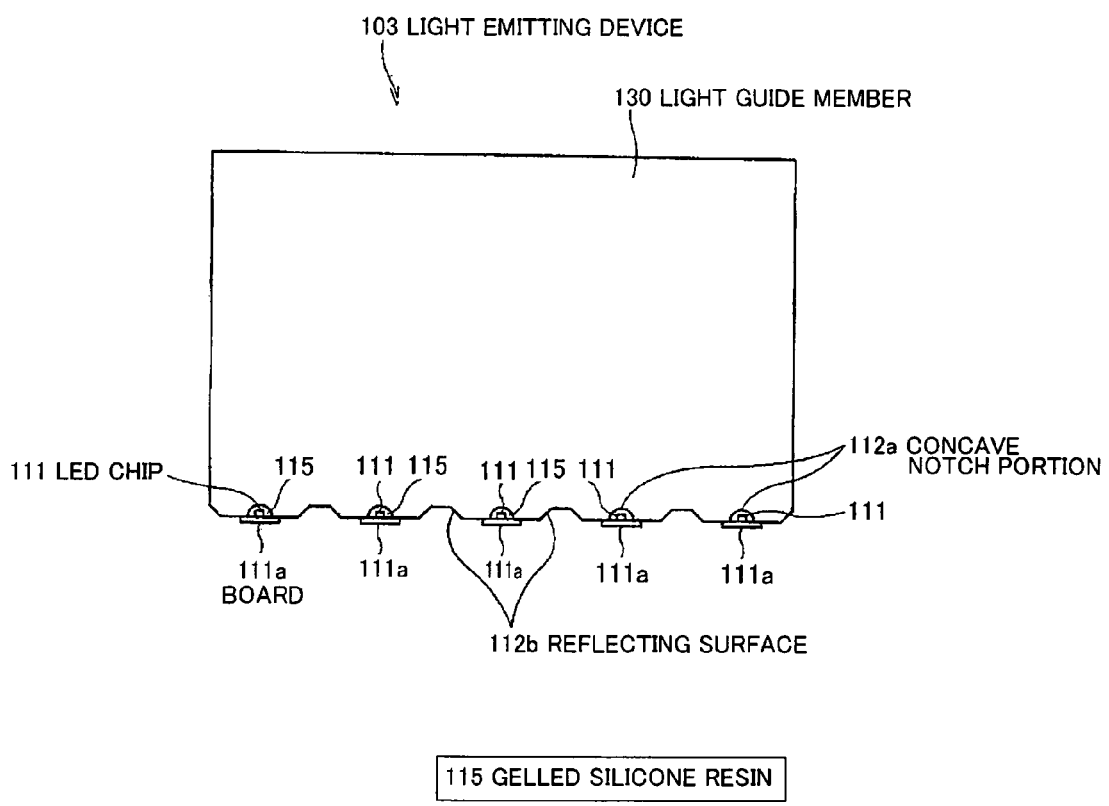

LIGHT EMITTING DEVICE AND LCD BACKLIGHTING DEVICE

The present application is based on Japanese patent application Nos. 2006-160554 and 2006-148750, the entire contents of which are incorporated herein by reference.

BACKGROUND OF THE INVENTION

1. Field of the Invention

This invention relates to a light emitting device that is used as, e.g., a backlight for an LCD (=liquid crystal display) device or push buttons of a cellar phone. This invention also relates to an LCD backlighting device using the light emitting device.

2. Description of the Related Art

An LCD backlighting device is known which is composed of multiple light sources (=light emitting devices) and a light guide plate which is disposed near the light sources to allow light emitted from the light sources to be uniformly guided to a LCD panel. For example, the backlighting device is constructed such that silicone resin is filled at the interface between a light emitting device with an LED (=light emitting diode) element and a light guiding portion of a light guide plate in order not to form an air layer at the interface (See JP-A-2003-234008, paragraphs [0010]-[0013] and [0019] and FIGS. 1-2). In this construction, because of forming no air layer at the interface, reflection at the interface can be reduced to efficiently guide light from the LED element into the light guide plate.

However, in the conventional LCD backlighting device, an LED package (=light emitting device) thereof is structured such that a cone-shaped reflector has a sidewall protruding from the mount surface of the LED element. Therefore, the output angle of light from the LED element is restricted to narrow the light distribution range of each light emitting device. If the interval of the multiple light emitting devices is enlarged to reduce the number of the LED elements used, a portion with reduced brightness may be produced between the light emitting devices to cause a problem on unevenness in brightness.

Furthermore, the conventional LCD backlighting device needs to be produced such that a sealing portion is formed by filling a sealing resin into the cone-shaped reflector and then the silicone resin is filled between the light guide plate and the sealing portion (i.e., into the interface therebetween). Thus, the productivity and workability thereof lowers.

SUMMARY OF THE INVENTION

It is an object of the invention to provide a light emitting device and an LCD backlighting device that can provide for a wide light distribution range without unevenness in brightness even when reducing the number of the LED elements used.

It is a further object of the invention to provide a light emitting device and an LCD backlighting device that can provide for an enhanced light input efficiency and can be produced with excellent productivity and workability.

(1) According to one embodiment of the invention, a light emitting device comprises:

a mount comprising a protruding portion that comprises an element mounting surface on which a light emitting element is mounted and a first lead and a second lead are exposed; and the light emitting element comprising a first electrode and a second electrode that are electrically connected to the first lead and the second lead, respectively.

In the above composition, there is no light blocking object in the light outputting direction of the light emitting element mounted on the element mounting surface of the protruding portion of the mount. Therefore, the light distribution range can be widened.

(2) According to another embodiment of the invention, a light emitting device comprises:

a mount comprising a protruding portion that comprises an element mounting surface on which a light emitting element is mounted and a first lead and a second lead are exposed;

the light emitting element comprising a first electrode and a second electrode that are electrically connected to the first lead and the second lead, respectively; and a transparent phosphor layer comprising a phosphor to be excited by a light emitted from the light emitting element, the phosphor layer being disposed covering a light outputting surface of the light emitting element.

In the above composition, a light emitted from the light emitting element is converted by the phosphor layer into a light with a different color, whereby the converted light can be mixed with the light directly passing through the phosphor layer to obtain a white light. Further, since there is no light blocking object in the light outputting direction of the light emitting element mounted on the element mounting surface of the protruding portion of the mount, the light distribution range can be widened.

(3) According to another embodiment of the invention, an LCD backlighting device comprises:

a plurality of light emitting devices arrayed; and a light guide member comprising a light inputting end face, the light guide member being adapted to receive a light from the plurality of light emitting devices through the light inputting end face and to output the light to a back surface of an LCD panel, wherein the plurality of light emitting devices each comprise a mount comprising a protruding portion that comprises an element mounting surface on which a light emitting element is mounted and a first lead and a second lead are exposed, and the light emitting element comprising a first electrode and a second electrode that are electrically connected to the first lead and the second lead, respectively.

In the above composition, since there is no light blocking object in the light outputting direction of the light emitting element mounted on the element mounting surface of the protruding portion of the mount, the light distribution range can be widened such that no unevenness in brightness is generated between the light emitting devices.

(4) According to another embodiment of the invention, a light emitting device comprises:

a light emitting element;

a light guide member comprising a light inputting surface through which to input a light from the light emitting element into the light guide member, and a light outputting surface through which to output the light from the light guide member; and a gelled silicone resin provided between the light inputting surface and the light emitting element, wherein the light inputting surface comprises a notch portion formed thereon to house the light emitting element, and the gelled silicone resin is filled between the light emitting element and the notch portion.

In the above composition, since the light inputting surface of the light guide member can be in close contact with the light emitting element by the gelled silicone resin while preventing the occurrence of voids therebetween, the light input efficiency from the light emitting element into the light guide member can be enhanced. Further, due to the enhanced light input efficiency, the number of the light emitting element used can be reduced.

BRIEF DESCRIPTION OF THE DRAWINGS

The preferred embodiments according to the invention will be explained below referring to the drawings, wherein:

FIG. 4 is a plain view showing Example 1 according to the invention;

FIG. 5 is a plain view showing Example 2 according to the invention;

FIG. 6 is a plain view showing Example 3 according to the invention;

FIG. 7 is a broken perspective view showing a backlighting device in a third preferred embodiment according to the invention;

FIG. 11 is a broken perspective view showing a backlighting device in a fifth preferred embodiment according to the invention; and FIG. 12 is a plain view showing an example of a large backlighting device according to the invention.

DETAILED DESCRIPTION OF THE PREFERRED EMBODIMENTS

First Embodiment

Composition of Light Emitting Device

Figure 1:
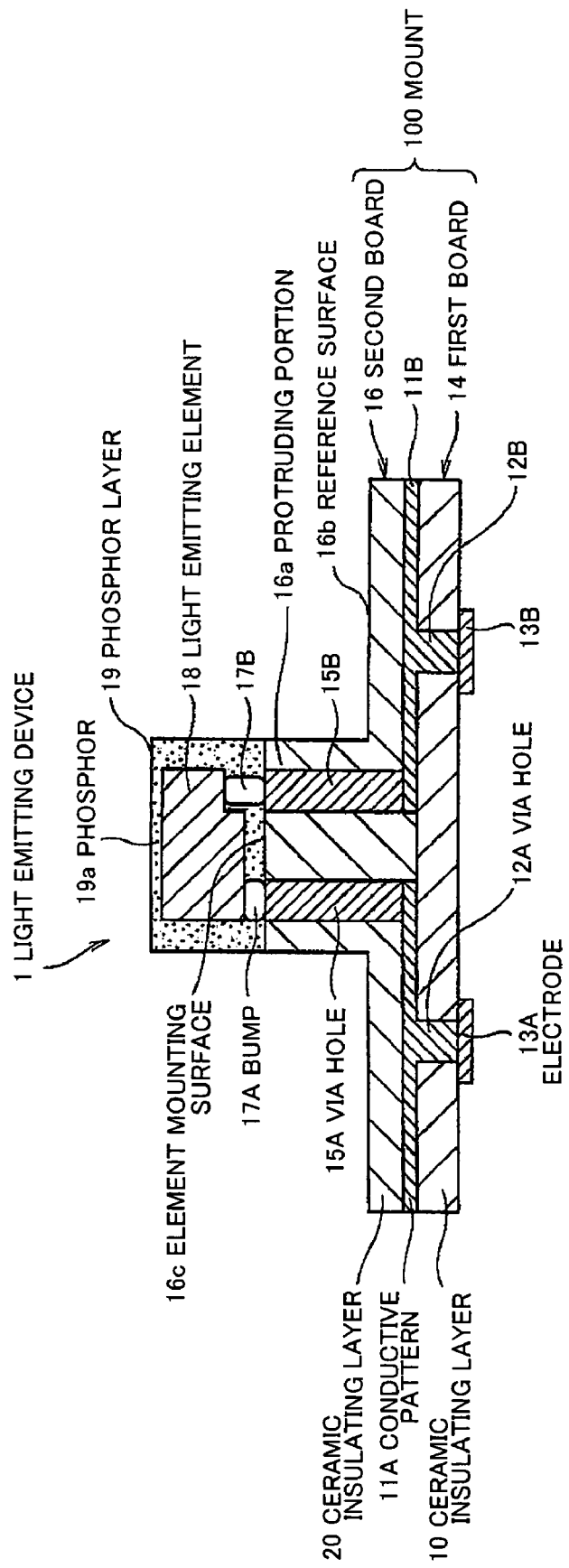
FIG. 1 is a cross sectional view showing a light emitting device in a first preferred embodiment according to the invention.

FIG. 1 is a cross sectional view showing a light emitting device in the first preferred embodiment according to the invention. The light emitting device 1 is composed of a mount 100 and a light emitting element mounted on the mount 100. The mount 100 is composed of a first planar board 14 and a second board 16 which are stacked.

The first board 14 is composed of a ceramic insulating layer 10, conductive patterns 11A, 11B which are formed on the upper surface of the ceramic insulating layer 10 by screen printing etc., via holes 12A, 12B one end of which is connected to the conductive patterns 11A, 11B, and first and second electrodes 13A, 13B which are formed on the lower surface of the ceramic insulating layer 10 and connected to the other end of the via holes 12A, 12B. The via holes 12A, 12B are formed by metalizing the inner surface of insulating holes.

The second board 16 is composed of a ceramic insulating layer 12 which has a columnar protruding portion 16a (which serves as an element mounting portion and hereinafter called protruding portion) at the center thereof, and first and second via holes 15A, 15B which are formed in the protruding portion 16a while being connected to the conductive patterns 11A, 11B and serves as first and second leads, respectively.

The upper surface of the second board 16 except the protruding portion 16a is used as a reference surface 16b for attaching the second board 16 to a light guide member.

The light emitting element 18 is a flip-chip type and is fabricated by sequentially growing an n-type layer, layers including a light emitting layer and a p-type layer on a sapphire substrate by MOCVD (metalorganic chemical vapor deposition) etc. It may be, e.g., a blue GaN-based compound semiconductor LED (=light emitting diode) to emit a blue light with an emission wavelength of 450 to 480 nm from the sapphire substrate side. Further, the light emitting element 18 is composed of a phosphor layer 19 covering the top and side faces thereof.

The phosphor layer 19 is composed of a transparent resin such as silicone resin, epoxy resin, fluorine resin and urea resin, and a phosphor 19a mixed in the resin to emit a white light. It is formed with a predetermined thickness on the top, bottom and side surfaces of the light emitting element 18. The phosphor 19a may include various inorganic and organic phosphor materials. For example, the inorganic phosphor materials may include materials containing a rare-earth element, such as YAG (yttrium aluminum garnet)-based phosphors, which include cerium-activated garnet-based phosphors composed of at least one selected from Y, Lu, Sc, La, Gd and Sm, and at least one selected from Al, Ga and In. One example thereof is $Y_3Al_5O_{12}$:Ce.

Composition of Light Emitting Element

Figure 2:
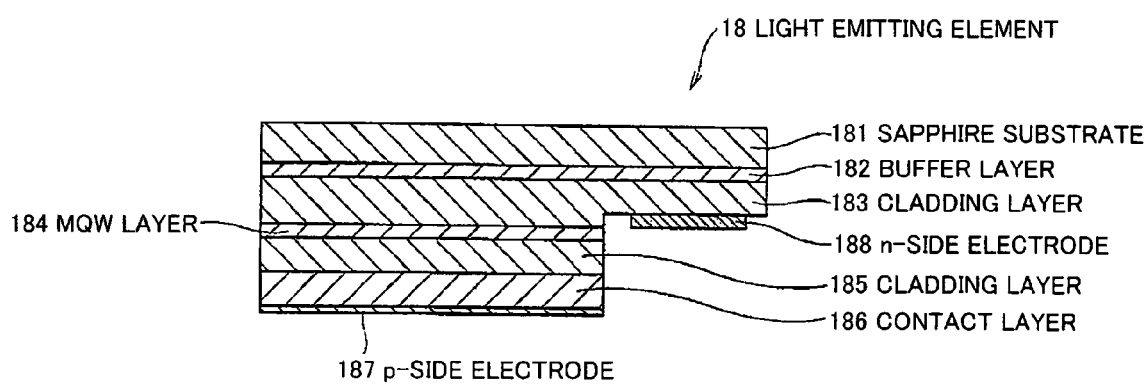
FIG. 2 is a cross sectional view showing a light emitting element in FIG. 1.

FIG. 2 is a cross sectional view showing the light emitting element 18. The light emitting element 18 is composed of, sequentially grown on one surface of the sapphire substrate 181, an AlN buffer layer 182, an n-type GaN cladding layer 183, an MQW (multiquantum well) layer 184, a p-type AlGaN cladding layer 185, and a p-GaN contact layer 186. Further, a p-side electrode 187 is formed on the p-type contact layer 186 and an n-side electrode 188 on the n-type cladding layer 183. As shown in FIG. 1, a bump 17A is connected to the p-side electrode 187 and a bump 17B is connected to the n-side electrode 188.

The sapphire substrate 181 may be replaced by a substrate formed of silicon, silicon carbide, zinc oxide, gallium phosphide, magnesium oxide etc.

Operation of Light Emitting Device

The operation of the light emitting device 1 will be described below referring to FIGS. 1 and 2.

When a predetermined DC voltage is applied between the first and second electrodes 13A and 13B, a drive current is flown along the path from the first electrode 13A through the via hole 12A, the conductive pattern 11A, the via hole 15A, the bump 17A, the light emitting element 18, the bump 17B, the via hole 15B, the conductive pattern 11B and the via hole 12B to the second electrode 13B.

By the drive current, the MQW layer 184 of the light emitting element 18 emits a blue light mainly upward (i.e., from the MQW layer 184 toward the sapphire substrate 181) in FIG. 1. The blue light emitted from the light emitting element 18 is inputted to the phosphor layer 19, a part thereof is absorbed by the phosphor 19a, and the other part passes directly through the phosphor layer 19. The phosphor 19a converts the absorbed blue light into a yellow light. The blue light passing through the phosphor layer 19 and the yellow light are both discharged in the range of about 180 degrees around the bottom face (i.e., the bottom face of the sapphire substrate 181) of the light emitting element 18, where the two lights are mixed to produce a white light and the white light is then inputted to the light guide member etc.

Effects of the First Embodiment

The following effects are obtained by the first embodiment.

(1) Since the light emitting device 1 is not provide with any package or cone-shaped reflector which can block the light emitted from the light emitting element 18, the wide light distribution range can be obtained. Therefore, when it is applied to a backlighting device etc., unevenness in brightness is not caused.

(2) Since the wide light distribution range of the light emitting element 18 can be obtained as described in (1), the number of the light emitting elements 1 used to compose the backlighting device can be reduced without causing the unevenness in brightness.

Although in the first embodiment the white light is produced by the combination of the light emitting element 18 to emit the blue light and the phosphor layer 19 to emit the yellow light by being excited, the invention is not limited to the combination. For example, a light emitting element to emit a short-wave light, i.e., a UV light with a main emission peak of about 400 nm may be used instead of the light emitting element 18. In this case, it is preferred that the phosphor layer 19 is composed of a resin relatively resistant to the UV light or glass and a phosphor adapted to emit a visible light by absorbing the UV light. Using the short-wave light, a white light can be produced by the phosphor layer 19 formed by mixing phosphors to emit red, blue and green lights, respectively, e.g., $Y_2O_2S$:Eu as a red phosphor, $Sr_5(PO_4)_3Cl$:Eu as a blue phosphor and $(SrEu)O.Al_2O_3$ as a green phosphor into a UV resistant resin etc.

When the light emitting element 1 is used for a backlighting device requiring a monochromatic backlight, such as a red light, except the white light, the light emitting element 18 can be a red light emitting element without using the phosphor layer 19.

Second Embodiment

Composition of Light Emitting Device

Figure 3A:
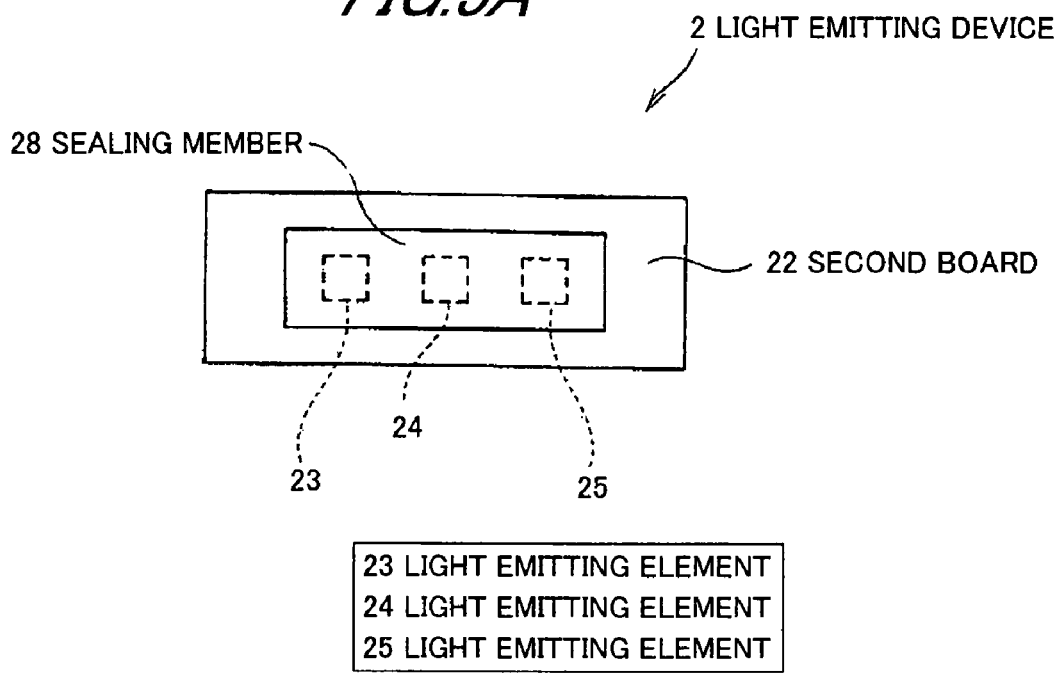
FIGS. 3A and 3B are a plain view and a front view, respectively, showing light emitting device in a second preferred embodiment according to the invention.
Figure 3B:
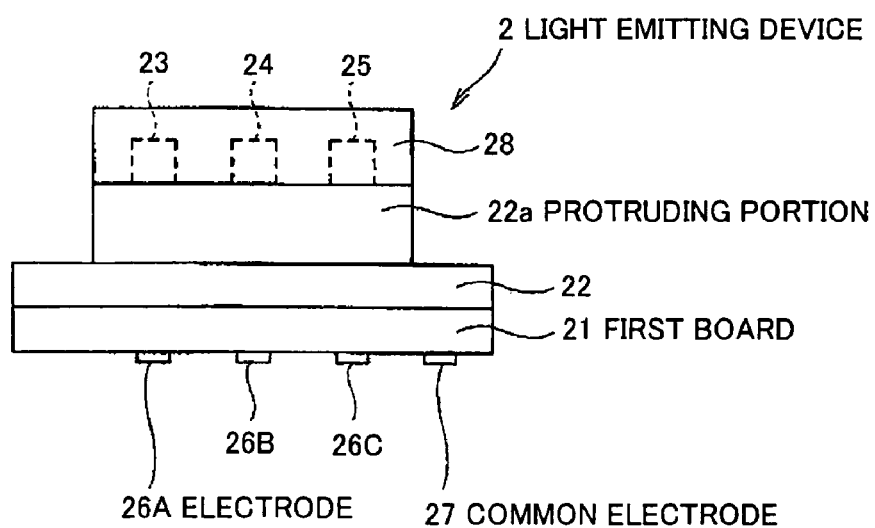

FIGS. 3A and 3B are a plain view and a front view, respectively, showing light emitting device in the second preferred embodiment according to the invention. In this embodiment, the light emitting device 2 uses three light emitting elements to emit red (R), green (G) and blue (B), respectively.

The light emitting device 2 is composed of a first planar board 21 and a second board 22 which has a protruding portion 22a and stacked on the first board 21, the light emitting elements 23 to 25 which are arrayed on the second board 22, and a transparent sealing member 28 which is formed on the top face of the protruding portion 22a while covering the light emitting elements 23 to 25. The sealing member 28 is formed of a transparent resin such as silicone resin, epoxy resin, fluorine resin and urea resin.

The first and second boards 21, 22 can be formed of, e.g., a board with a ceramic insulating layer. They are provided with conductive patterns and via holes (which are formed inside thereof and both not shown) connected to the light emitting elements 23 to 25, electrodes 26A to 26C connected to the conductive patterns, and a common electrode 27 to which the anodes or cathodes of the electrodes 26A to 26C are connected in parallel. The first and second boards are integrated by being bonded each other with adhesives, as is the case with the first embodiment.

The light emitting element 23 to emit a red light is an LED element formed of, e.g., AlGaAs, GaP or GaAsP. The light emitting element 24 to emit a green light is an LED element formed of, e.g., GaP. The light emitting element 25 to emit a blue light is an LED element formed of, e.g., InGaN or GaN.

The light emitting elements 23 to 25 are arrayed at certain intervals on the protruding potion 22a of the second board 22, and the sequence thereof can be set arbitrarily.

Operation of Light Emitting Device

The operation of the light emitting device 2 will be described below.

When a predetermined DC voltage is applied between the electrodes 26A to 26C and the common electrodes 27, a drive current is flown through the light emitting device 2. By the drive current, the light emitting elements 23 to 25 simultaneously emit the red, green and blue lights, which pass through the sealing member 28 and are then discharged upward in FIG. 3B. The three lights, i.e., R, G and B lights emitted from the light emitting elements 23 to 25 are mixed over the light emitting device 2 to produce a white light.

Alternatively, by driving only any one or two of the light emitting elements 23 to 25, the emitted light can be rendered monochromatic or two-color mixed.

Effects of the Second Embodiment

The following effects are obtained by the second embodiment.

(a) Since the light emitting device 2 is not provide with any package or cone-shaped reflector which can block the light emitted from the light emitting elements 23 to 25, the wide light distribution range can be obtained. Therefore, when it is applied to a backlighting device etc., unevenness in brightness is not caused. Further, by driving the light emitting elements 23 to 25 simultaneously, the amount of light can be increased as compared to that in the first embodiment.

(b) Since the sealing member 28 is formed to cover the light emitting elements 23 to 25, the light emitting elements 23 to 25 can be prevented from a shock etc.

Although in the second embodiment the light emitting elements for R, G and B lights are separately provided to produce a white light, a light emitting element can be used in which bare chips for R, G and B lights are fabricated in one chip. Although the light emitting elements 23 to 25 are arrayed linearly as shown in FIGS. 3A and 3B, they may be disposed, e.g., at apexes of a regular triangle.

Example 1

FIG. 4 is a plain view showing Example 1 according to the invention. Example 1 provides for a side-view type backlighting device using the plural light emitting devices of the first embodiment. The backlighting device 3 is composed of a light guide plate 32 with plural concave portions 31 formed on one side thereof, and the plural light emitting devices 1 as shown in FIG. 1, where the protruding portion 16a of the light emitting devices 1 is disposed fitted into each of the concave portions 31 and the light emitting devices 1 are bonded to the light guide plate 32 with adhesives etc. The inner face of the concave portion 31 serves as an input end face of light emitted from the light emitting element. The concave portions 31 may be filled with epoxy resin or silicone resin.

The light guide plate 32 is formed of a transparent resin such as methacrylic resin. Although a backlighting device for an LCD panel is generally provided with some components, i.e., a reflecting sheet, a diffusing sheet etc. on one face and with a polarizing plate, an LCD panel etc. on the other face, the components are all omitted in FIG. 4.

In operation for the composition as shown in FIG. 4, when a drive current flows through the light emitting devices 1, a blue light emitted is inputted into the light guide plate 32, reflected repeatedly several times in the light guide plate 32, and finally discharged in the thickness direction thereof to backlight the LCD panel etc.

In Example 1, light from the light emitting device 1 is outputted in the range of about 180 degrees through the concave portion 31 into the light guide plate 32, and any hindrance such as a package to block the emitted light does not exist between the light emitting devices 1. Therefore, even when the interval between the light emitting devices 1 is increased, the backlighting device 3 can be prevented from causing unevenness in brightness.

Meanwhile, in Example 1, the emission color of the light emitting device 1 is not limited to blue and may be freely optioned.

Example 2

FIG. 5 is a plain view showing Example 2 according to the invention.

A light emitting device 4 of Example 2 is different from the light emitting device 1 in FIG. 1 in that a transparent resin layer 50 is formed instead of the phosphor layer 19. The other components of the light emitting device 4 are the same as the light emitting device 1 in FIG. 1.

Since the light emitting device 4 of Example 2 is not provided with the phosphor layer 19, a blue light from the light emitting element 18 passes through directly the resin layer 50 and discharged in the range of about 180 degrees. Therefore, the blue backlight is provided for a backlighting device.

In Example 2, by forming the resin layer 50, the light emitting device 4 can be protected from a shock etc.

Example 3

FIG. 6 is a plain view showing Example 3 according to the invention.

Example 3 is constructed such that the backlighting device 3 in FIG. 4 uses the light emitting device 4 in FIG. 5 instead of the light emitting device 1 and the light guide plate 32 thereof is provided with a phosphor portion 33. The other components of the backlighting device 3 in Example 3 are the same as shown in FIG. 4.

The light guide plate 32 is composed of the phosphor portion 33 in which a phosphor 33a with the same ingredients as the phosphor 19a in the first embodiment is mixed and the plural concave portions 31 is formed at certain intervals, and a planar main body 34 integral with the phosphor portion 33. The concave portion 31 may be filled with epoxy resin or silicone resin.

Although a backlighting device for an LCD panel is generally provided with some components, i.e., a reflecting sheet, a diffusing sheet etc. on one face and with a polarizing plate, an LCD panel etc. on the other face, the components are all omitted in FIG. 6.

In operation for the composition as shown in FIG. 6, when a drive current flows through the light emitting element 18 of the light emitting devices 4, a blue light emitted is inputted into the phosphor portion 33 of the light guide plate 32. The phosphor 33a of the phosphor portion 33 is excited by the blue light from the light emitting device 4 to convert the blue light into a yellow light. A white light is produced by the mixture of the yellow light and the blue light passing through directly the phosphor portion 33. The white light is reflected repeatedly several times in the light guide plate 32, and finally discharged in the thickness direction thereof to backlight the LCD panel etc.

In Example 3, light from the light emitting device 4 is outputted in the range of about 180 degrees through the concave portion 31 into the light guide plate 32, and any hindrance such as a package to block the emitted light does not exist between the light emitting devices 4. Therefore, even when the interval between the light emitting devices 3 is increased, the backlighting device 3 can be prevented from causing unevenness in brightness. Furthermore, by forming the phosphor portion 33, the white light can be uniformly produced.

Other Embodiments

Although in the above embodiments the first and second boards are bonded by adhesives, they may be integrally bonded by sintering.

Although in the above embodiments the invention is applied to the LCD backlighting device, it is not limited thereto and may be applied to a light source for an indicator light, a traffic light etc. where the light emitting devices are arrayed in a matrix, or to a light source for a push button of an electronic device.

Third Embodiment

Composition of Light Emitting Device

Figure 8:
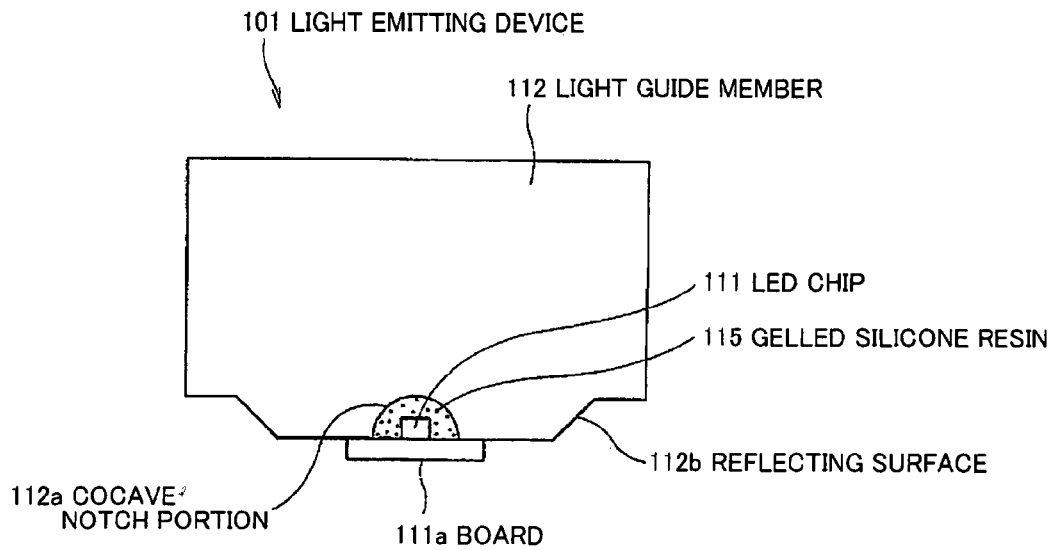
FIG. 8 is a front view showing a light emitting device in FIG. 7.
Figure 9:
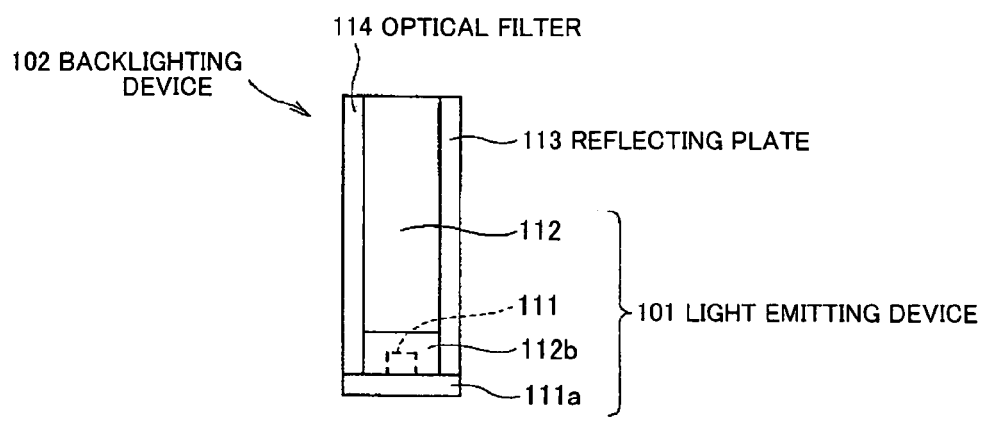
FIG. 9 is a side view showing the backlighting device in FIG. 7.

FIG. 7 is a broken perspective view showing a backlighting device in the third preferred embodiment according to the invention. FIG. 8 is a front view showing a light emitting device in FIG. 7. FIG. 9 is a side view showing the backlighting device in FIG. 7.

The light emitting device 101 is composed of an LED (light emitting diode) chip 111 mounted on a board 111a, and a planar light guide member 112 to which the board 111a with the LED chip 111 mounted thereon is attached at a predetermined position thereof.

The backlighting device 102 for an LCD panel is composed such that a reflecting plate 113 is attached onto one face of the light guide member 112 of the light emitting device 101, and an optical filter 114 is attached onto the other face (i.e., light outputting surface) of the light guide member 112.

The backlighting device 102 is mainly adapted to input a white light into the light guide member 112. Along with this, the LED chip 111 is composed such that it is formed of, e.g., a GaN-based compound semiconductor to emit a blue light and is, on a light discharging surface thereof, provided with a phosphor layer (not shown) formed of a transparent resin etc. with a phosphor such as YAG (yttrium aluminum garnet) mixed thereinto to produce a white light.

The LED chip 111 may be formed of a semiconductor material to emit a UV light instead of the blue light. In this case, it is desired that the phosphor layer is composed of a resin relatively resistant to the UV light or glass and a phosphor adapted to emit a visible light by absorbing the UV light. For example, such a phosphor may be, e.g., $Y_2O_2S:Eu$ as a red phosphor, $Sr_5(PO_4)_3Cl:Eu$ as a blue phosphor and $(SrEu)O.Al_2O_3$ as a green phosphor, which can be mixed into a UV resistant resin etc. to produce a white light.

The light guide member 112 may be formed of methacrylic resin, polycarbonate resin, norbornene resin, polystyrene resin, cycloolefin polymer resin etc. It is composed of a concave notch portion 112a to which the board 111a with the LED chip 111 mounted thereon is attached, and a reflecting surface 112b formed on both sides of the concave notch portion 112a. The light guide member 112 may be, if necessary, rendered uneven in thickness or concave-convex in surface in order to allow the uniform spreading of light from the LED chip 111.

The notch portion 112a of the light guide member 112 allows a sufficient space from there to the LED chip 111. The space is filled with a transparent gelled silicone resin (silicone gel) 115 as shown in FIG. 8. The gelled silicone resin 115 includes a UV-curable type, a heat-curable type etc. The gelled silicone resin 115 may contain the abovementioned phosphor. In this case, it may be unnecessary to provide the LED chip 111 with the phosphor layer.

The reflecting surface 112b of the light guide member 112 is formed by cutting with a slope the corner of the light guide member 112, and by depositing a high-reflectivity metal on the cut surface.

The reflecting plate 113 is adapted to reflect back a light leaking from the back of the light guide member 112 to the side of the light guide member 112, and is formed by, e.g., depositing a high-reflectivity film on a resin film.

The optical filter 114 is adapted to align a light from the light guide member 112 in the front direction (i.e., in the direction of the LCD panel), and is formed of, e.g., a BEF (band elimination filter), so-called "prism sheet" and polarizing plate. It is desired that a diffusing sheet is placed between the optical filter 114 and the light guide member 112, or between the light guide member 112 and the reflecting plate 113.

A method of producing the light emitting device 101 and the backlighting device 102 will be explained below referring to FIGS. 7 to 9.

Production Method of Light Emitting Device

The production method of the light emitting device 101 as shown in FIG. 8 will be explained below.

First, a small thin plate (not shown) of resin etc. is temporarily attached onto one face of the light guide member 112. Then, the board 111a is positioned to the light guide member 112 such that the LED chip 111 comes to the center of the concave notch portion 112a, and the board 111a is fixed to the light guide member 112 by adhesives etc. Then, with the thin plate facing downward, the gelled silicone resin 115 is filled into the concave notch portion 112a as shown in FIG. 8, and the gelled silicone resin 115 is then hardened by heating, UV irradiation etc. if necessary. Then, the thin plate is removed from the light guide member 112, whereby the light emitting device as shown in FIG. 8 can be produced.

Then, the light emitting device 101 thus produced is used to produce the backlighting device 102, where the reflecting plate 113 as shown in FIG. 7 is bonded to one surface of the light guide member 112, and the optical filter 114 as shown in FIG. 7 is bonded to the other surface of the light guide member 112.

Production Method 1 of Backlighting Device

A method of producing simultaneously the light emitting device 101 in the process of producing the backlighting device 102 will be explained below.

First, the reflecting plate 113 is bonded to one face of the light guide member 112. Then, the board 111a is positioned to the light guide member 112 such that the LED chip 111 comes to the center of the concave notch portion 112a, and the board 111a is fixed to the light guide member 112 by adhesives etc.

Then, with the reflecting plate 113 facing downward, the gelled silicone resin 115 is filled into the concave notch portion 112a as shown in FIG. 8, and the gelled silicone resin 115 is then hardened by heating, UV irradiation etc. if necessary, whereby the light emitting device with the reflecting plate 113 can be produced.

Then, the optical filter 114 is bonded to the other face of the light guide member 112 such that no air bubbles or voids are generated in the concave notch portion 112a. Thus, the backlighting device 102 as shown in FIG. 9 can be completed. The order of bonding the reflecting plate 113 or the optical filter 114 to the light guide member 112 may be reversed.

Production Method 2 of Backlighting Device

First, as shown in FIG. 7, the reflecting plate 113 and the optical filter 114 are positioned on both sides of the light guide member 112, and they are then bonded to the light guide member 112. Then, the light guide member 112 is inverted such that the concave notch portion 112a faces upward, and the gelled silicone resin 115 is filled into the concave notch portion. The amount of the gelled silicone resin 115 is controlled such that no sir bubbles ore voids are generated when the board 111a with the LED chip 111 mounted thereon is attached to the concave notch portion 112a.

Then, the board 111a is attached to the light guide member 112, while positioning the LED chip 111 at the center of the concave notch portion 112a, by using the adhesives if necessary. The gelled silicone resin 115 is hardened by heating or UV irradiation etc. if necessary. Thus, the backlighting device 102 as shown in FIG. 9 can be completed.

Operation of Backlighting Device

When a predetermined voltage is applied to the LED chip 111, the LED chip 111 emits a light. The light from the LED chip 111 is outputted in the range of about 180 degrees and inputted into the gelled silicone resin 115, where a part of the light is directly inputted into the light guide member 112 and reflected therein repeatedly, and the other part thereof is reflected on the reflecting surface 112b and inputted into the light guide member 112 and reflected therein repeatedly. In this process, light leaking into the reflecting plate 113 is reflected thereon and then passes through the light guide member 112 into the optical filter 114.

Thus, the light inputted in the light guide member 112 is finally outputted to the optical filter 114, where it is aligned in the front direction (i.e., in the direction of the LCD panel) and then outputted to the LCD panel (not shown).

Effects of the Third Embodiment

The following effects are obtained by the third embodiment.

(a) Since the light guide member 112 is provided with the concave notch portion 112a and the LED chip 111 with the board 111a is disposed facing the concave notch portion 112a and the gelled silicone resin 115 is filled in the concave notch portion 112a, the generation of voids can be prevented between the LED chip 111 and the light guide member 112 so that the light input efficiency into the light guide member 112 from the LED chip 111 can be enhanced.

(b) By providing the reflecting surfaces 112b on both sides of the concave notch portion 112a of the light guide member 112, light from the LED chip 111 can be led to the back of the light guide member 112 so that it can be efficiently used.

(c) Since the light input efficiency can be enhanced as described in (a), the number of the LED chips 111 can be reduced when the backlighting device uses the plural LED chips 111.

Fourth Embodiment

Figure 10:
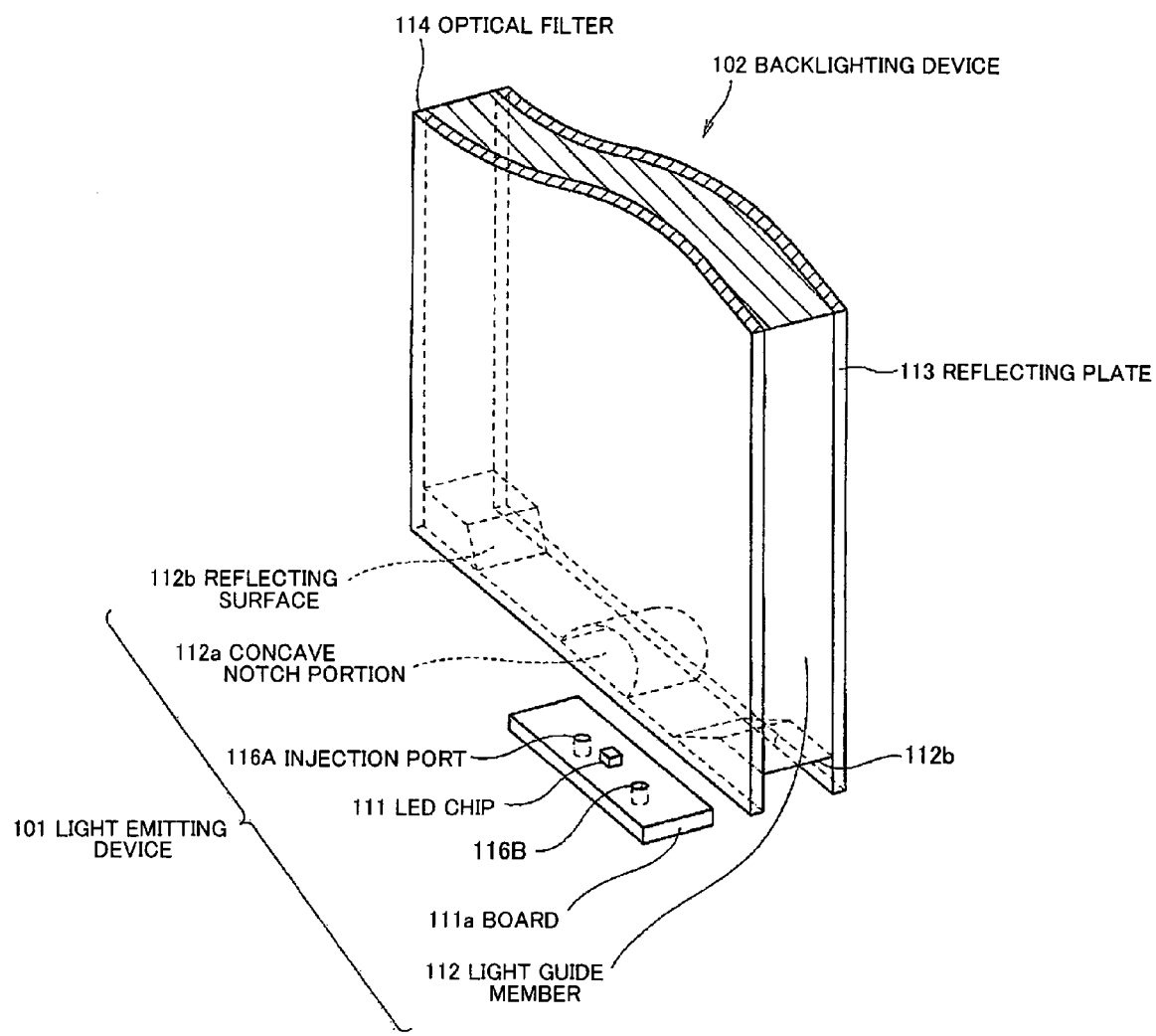
FIG. 10 is a perspective view showing a backlighting device in a fourth preferred embodiment according to the invention.

FIG. 10 is a perspective view showing a backlighting device in the fourth preferred embodiment according to the invention. In FIG. 10, the LED chip 111 is shown as the state before it is attached to the light guide member 112. The fourth embodiment is different from the third embodiment in that the board 111a is provided with injection holes 116A, 116B formed on both sides of the LED chip 111, whereby the gelled silicone resin 115 can be injected into the concave notch portion 112a through one of the injection holes 116A, 116B. The other components thereof are the same as shown in the third embodiment.

In producing the backlighting device of the fourth embodiment, the reflecting plate 113 and the optical filter 114 are first bonded onto both faces of the light guide member 112. Then, the LED chip 111 and the board 111a are positioned opposed to the concave notch portion 112a, and the board 111a is fixed to the light guide member 112 by adhesives etc.

Then, the light guide member 112 is inverted such that the LED chip 111 faces upward. Then, the gelled silicone resin is injected into the concave notch portion 112a through one of the injection holes 116A, 116B by using an injector etc. to fill the resin in the concave notch portion 112a. In this case, the other of the injection holes 116A, 116B serves as an air vent port. It is preferred that the concave notch portion 112a and the light emitting device 101 are located upward during the filling in order to facilitate the filling of the gelled silicone resin.

Effects of the Fourth Embodiment

In the fourth embodiment, since the gelled silicone resin is injected through the injection hole 116A or 116B, the gelled silicone resin can be easy filled in the concave notch portion 112a. Further, since the amount of the excess gelled silicone resin spilling out of the concave notch portion 112a can be reduced by using the injection hole 116A or 116B, the workability and productivity can be enhanced. The other effects are the same as obtained in the third embodiment.

Fifth Embodiment

Composition of Backlighting Device

FIG. 11 is a broken perspective view showing a backlighting device in the fifth preferred embodiment according to the invention.

The fifth embodiment is different from the third embodiment in that, instead of the LED chip 111 mounted on the board 111a, three LED chips 121R, 121G and 121B to emit a red light (R), a green light (G) and a blue light (B), respectively, are mounted on a board 120. The other components thereof are the same as shown in the third embodiment.

The LED chip 121R is formed of, e.g., GaAs-based ($Al_{1-X}Ga_XAs$ ($0 \leq X \leq 1$)), GaP-based ($Al_{1-X-Y}In_YGa_XAs$ ($0 \leq X \leq 1$, $0 \leq Y \leq 1$)) semiconductor and emits a red light. The LED chip 121G is formed of, e.g., GaP-based ($Al_{1-X-Y}In_YGa_XAs$ ($0 \leq X \leq 1$, $0 \leq Y \leq 1$)), GaN-based ($Al_{1-X-Y}In_YGa_XN$ ($0 \leq X \leq 1$, $0 \leq Y \leq 1$)) semiconductor and emits a green light. The LED chip 121B is formed of, e.g., GaN-based ($Al_{1-X-Y}In_YGa_XN$ ($0 \leq X \leq 1$, $0 \leq Y \leq 1$)) semiconductor and emits a blue light. The sequence of the LED chips 121R, 121G and 121B can be freely optioned.

Production Method of Backlighting Device

An example of the method of producing the backlighting device 102 of the fifth embodiment will be explained below.

First, the reflecting plate 113 is bonded to one face of the light guide member 112. Then, the board 120 is positioned to the light guide member 112 such that the LED chip 121G is located at the center of the concave notch portion 112a, and the board 120 is fixed to the light guide member 112 by adhesives etc.

Then, the gelled silicone resin is filled in the concave notch portion 112a such that it is split out of there, whereby the light emitting device 101 with the reflecting plate 113 can be obtained. Finally, the optical filter 114 is attached onto the other surface of the light guide member 112. Thus, the backlighting device 112 can be completed.

In the fifth embodiment, the order of bonding the reflecting plate 113 and the optical filter 114 to the light guide member 112 may be reversed. Furthermore, a material such as the thin film described earlier may be temporarily attached thereto instead of the reflecting plate 113 and the optical filter 114 when filling the gelled silicone resin in the concave notch portion 112a.

Operation of Backlighting Device

The operation of the backlighting device 102 will be described below.

When a predetermined DC voltage is applied to each of the LED chips 121R, 121G and 121B, the LED chips 121R, 121G and 121B emit R, G and B, respectively, which are discharged toward the concave notch portion 112a. The three-color lights from the LED chips 121R, 121G and 121B are mixed over the LED chips 121R, 121G and 121B, whereby a white light is inputted into the light guide member 112.

Effects of the Fifth Embodiment

In the fifth embodiment, since the white light is obtained by the mixture of the three-color lights from the LED chips 121R, 121G and 121B, it is not necessary to use any phosphor or phosphor layer. Furthermore, since the light source is composed of the LED chips 121R, 121G and 121B, the light intensity can be enhanced as compared to the third embodiment. The other effects are the same as obtained in the third embodiment.

Example

FIG. 12 is a plain view showing an example of a large backlighting device with a light emitting device 103 according to the invention. The light emitting device 103 uses a light guide member 130 that the plural concave notch portions 112a and reflecting surfaces 112b are disposed at certain intervals in accordance with the plural LED chips 111 and boards 111a, where each LED chip 111 is disposed opposed to the concave notch portion 112a and the gelled silicone resin is filled in the concave notch portion 112a.

Thus, since the light guide member 130 is composed of the plural concave notch portions 112a and reflecting surfaces 112b and the LED chip 111 disposed opposed to the concave notch portion 112a, it is suited to constructing the large backlighting device. By determining the number of the LED chips 111 used according to the size of the LCD panel, the light emitting device 103 can be adapted for LCD backlighting devices with various sizes.

Other Embodiments

The concave notch portion 112a is not limited to the semi-circular form in section, and may be a polygonal shape such as triangle or pentagonal in section.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A light emitting device, comprising:
a light emitting element; and
a mount comprising a protruding portion, the protruding portion comprising a flat element mounting surface on which the light emitting element is mounted and from which a first lead and a second lead are exposed,
wherein the light emitting element comprises a first electrode and a second electrode that are electrically connected to the first lead and the second lead, respectively, and
wherein only the flat element mounting surface of the protruding portion is covered with a sealing material.

2. The light emitting device according to claim 1, wherein the mount further comprises a first board, and a second board stacked on the first board, the second board comprising the protruding portion.

3. The light emitting device according to claim 1, wherein the light emitting element further comprises a light emitting diode to emit a blue light or a UV light.

4. The light emitting device according to claim 1, wherein:
the light emitting element comprises light emitting diodes to emit a red light, green and a blue light, respectively.

5. The light emitting device according to claim 4, wherein the sealing member comprises a transparent sealing member that covers the light emitting diodes.

6. The light emitting device according to claim 1, further comprising:
a transparent phosphor layer comprising a phosphor to be excited by a light emitted from the light emitting element, the phosphor layer being disposed covering a light outputting surface of the light emitting element.

7. The light emitting device according to claim 1, wherein the seating member comprises a transparent resin layer disposed covering a light outputting surface of the light emitting element.

8. The light emitting device according to claim 1, wherein the first lead and the second lead extend through the protruding portion in a direction perpendicular to the element mounting surface.

9. The light emitting device according to claim 2, further comprising a plurality of conductive patterns which are disposed between the first board and the second board, the conductive patterns being connected to the first lead and the second lead.

10. The light emitting device according to claim 1, wherein the protruding portion comprises a ceramic insulating layer.

* * * * *